(12) United States Patent
Cai et al.

(10) Patent No.: US 11,641,755 B2
(45) Date of Patent: May 2, 2023

(54) TOP-EMISSION TYPE ORGANIC ELECTROLUMINESCENT ELEMENT AND TOP-EMISSION TYPE ORGANIC ELECTROLUMINESCENT DEVICE

(71) Applicant: Xianyang Caihong Optoelectronics Technology Co.,Ltd, Xianyang (CN)

(72) Inventors: Qizhe Cai, Xianyang (CN); Yuanyuan Qi, Xianyang (CN)

(73) Assignee: XIANYANG CAIHONG OPTOELECTRONICS TECHNOLOGY CO., LTD, Xianyang (CN)

(*) Notice: Subject to any disclaimer, the term of this patent is extended or adjusted under 35 U.S.C. 154(b) by 110 days.

(21) Appl. No.: 17/315,482

(22) Filed: May 10, 2021

(65) Prior Publication Data

US 2022/0020954 A1 Jan. 20, 2022

(30) Foreign Application Priority Data

Jul. 20, 2020 (CN) .......................... 202010700423.X

(51) Int. Cl.
*H01L 51/52* (2006.01)
(52) U.S. Cl.
CPC .. *H01L 51/5234* (2013.01); *H01L 2251/5315* (2013.01); *H01L 2251/558* (2013.01)

(58) Field of Classification Search
CPC .................. H01L 51/5234; H01L 51/5231
See application file for complete search history.

(56) References Cited

U.S. PATENT DOCUMENTS

2003/0189401 A1* 10/2003 Kido .................... C07C 211/58
313/506

* cited by examiner

*Primary Examiner* — Anthony Ho
(74) *Attorney, Agent, or Firm* — WPAT, P.C

(57) ABSTRACT

A top-emission type organic electroluminescent (EL) element and a top-emission type organic EL device are provided. The top-emission type organic EL element includes a first electrode, an organic functional layer disposed on the first electrode, and a second electrode disposed on a side of the organic functional layer facing away from the first electrode. The second electrode includes a work-function adjustment layer and a transparent metal oxide layer. The work-function adjustment layer is disposed on the side of the organic functional layer facing away from the first electrode, and the transparent metal oxide layer is disposed on a side of the work-function adjustment layer facing away from the organic functional layer. The top-emission type organic EL element and the top-emission type organic EL device can improve the luminous efficiency and prolong the service life.

7 Claims, 4 Drawing Sheets

TOP-EMISSION TYPE ORGANIC ELECTROLUMINESCENT ELEMENT AND TOP-EMISSION TYPE ORGANIC ELECTROLUMINESCENT DEVICE

TECHNICAL FIELD

The disclosure relates to the field of optoelectronic devices, and more particularly to a top-emission type organic electroluminescent (EL) element and a top-emission type organic EL device.

DESCRIPTION OF RELATED ART

At present, an organic EL element has been developed rapidly not only in visual display such as a TV, a computer, a mobile phone and a vehicle display, but also in a solid-state lighting. In an Active-matrix display, the organic EL element is controlled by a thin film transistor (TFT). If the organic EL element emits a light in a form of a bottom emission, when the light passes through a substrate, it will be blocked by the TFT on the substrate, thus affecting the actual luminous area. If the light is emitted from a top of the organic EL element, the TFT on the substrate will not affect the luminous area of the organic EL element. Under the same brightness, the working voltage of the organic EL element is lower, the organic EL element can obtain a longer service life. Therefore, a top-emission type organic EL element is the first choice for the Active-matrix display of a small screen such as the mobile phone, the electrode setting is the most important in the top-emission type organic EL element, and the appropriate electrode will greatly improve the performance of the device.

SUMMARY

Accordingly, embodiments of the disclosure provide a top-emission type organic EL element and a top-emission type organic EL device, which can improve the luminous efficiency and prolong the service life.

Specifically, an embodiment of the disclosure provides a top-emission type organic EL element including a first electrode, an organic functional layer and a second electrode. The organic functional layer is disposed on the first electrode. The second electrode is disposed on a side of the organic functional layer facing away from the first electrode. The second electrode includes a work-function adjustment layer and a transparent metal oxide layer, the work-function adjustment layer is disposed on the side of the organic functional layer facing away from the first electrode, and the transparent metal oxide layer is disposed on a side of the work-function adjustment layer facing away from the organic functional layer.

In an embodiment of the disclosure, the second electrode further includes: a charge generation layer. The charge generation layer is disposed between the work-function adjustment layer and the transparent metal oxide layer; the charge generation layer includes a first-type charge generation layer and a second-type charge generation layer, the first-type charge generation layer is disposed on the side of the work-function adjustment layer facing away from the organic functional layer, and the second-type charge generation layer is disposed between the first-type charge generation layer and the transparent metal oxide layer.

In an embodiment of the disclosure, a thickness of the work-function adjustment layer is in a range from 5 nm to 50 nm, and a thickness of the transparent metal oxide layer is in a range from 10 nm to 150 nm.

In an embodiment of the disclosure, a thickness of the first-type charge generation layer is in a range from 2 nm to 10 nm, and a thickness of the second-type charge generation layer is in a range from 5 nm to 20 nm.

In an embodiment of the disclosure, the work-function adjustment layer includes one selected from the group consisting of lithium (Li), calcium (Ca), magnesium (Mg), ytterbium (Yb), and a transparent metal alloy; and the transparent metal alloy consists of at least two metals with different work functions.

In an embodiment of the disclosure, the first electrode is an anode, and the second electrode is a cathode.

In an embodiment of the disclosure, the organic functional layer is a monochromatic organic functional layer including a hole injection layer, a hole transportation layer, a light-emitting layer, an electron transportation layer and an electron injection layer sequentially stacked in that order.

In an embodiment of the disclosure, the organic functional layer is a polychromatic organic functional layer including a first hole injection layer, a first hole transportation layer, a first light-emitting layer, a first electron transportation layer, an N-type charge generation layer, a P-type charge generation layer, a second hole transportation layer, a second light-emitting layer, a second electron transportation layer and a first electron injection layer sequentially stacked in that order.

In addition, an embodiment of the disclosure provides a top-emission type organic EL device including a substrate, a drive control circuit layer and one of the top-emission type organic EL element mentioned above. The drive control circuit layer is disposed on the substrate. And the first electrode of the top-emission type organic EL element is disposed on the drive control circuit layer.

In an embodiment of the disclosure, the drive control circuit layer includes a plurality of transistors and a storage capacitor connected to the plurality of transistors; and the first electrode is connected to the plurality of transistors.

The embodiments of the disclosure can achieve one or more of the following beneficial effects: by setting the second electrode to include the work-function adjustment layer and the transparent metal oxide layer, the work-function adjustment layer is disposed on the side of the organic functional layer facing away from the first electrode, and the transparent metal oxide layer is disposed on the side of the work-function adjustment layer facing away from the organic functional layer, which makes the top-emission type organic EL element have the good conductivity and light transmittance, improves the efficiency of the electron injection into the organic functional layer, reduces the starting voltage, improve the light-emitting efficiency, avoid the damage of the organic material, prolong the service life, and use existing technology to complete the formation of the second electrode, the process is simple and mature, and the production cost can be controlled. By setting the second electrode layer further to include the charge generation layer disposed between the work-function adjustment layer and the transparent metal oxide layer, it can avoid the damage to the work-function adjustment layer when making the transparent metal oxide layer in the vacuum sputtering process, further reduce the oxidation damage of the organic materials in the organic functional layer, and further prolong the service life; it is not only suitable for a monochrome organic EL element, but also suitable for a polychromatic organic EL element, and therefore has a wide range of application.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative efforts.

DETAILED DESCRIPTION OF EMBODIMENTS

Technical solutions in embodiments of the disclosure will be clearly and fully described below, with reference to the accompanying drawings in the embodiments of the disclosure. Apparently, the described embodiments are merely some of embodiments of the disclosure, rather than all embodiments of the disclosure. Based on the described embodiments of the disclosure, all other embodiments obtained by those skilled in the art without any creative effort should belong to the protection scope of the disclosure.

It should be noted that terms "first" and "second" in the description and appended claims of the disclosure and the above-mentioned drawings are used to distinguish similar objects, and not necessarily used to describe a specific sequence or order. It should be understood that the terms used in this way can be interchanged under appropriate circumstances so that the embodiments of the disclosure described herein can be implemented in an order other than those illustrated or described herein. In addition, the terms "including" and "having" and any variations of them are intended to cover non-exclusive inclusions. For example, a process, a method, a system, a product, or a device that includes a series of steps or units is not necessarily limited to those clearly listed and may include other steps or units that are not clearly listed or are inherent to the process, the method, the product or the device.

First Embodiment

Figure 1:
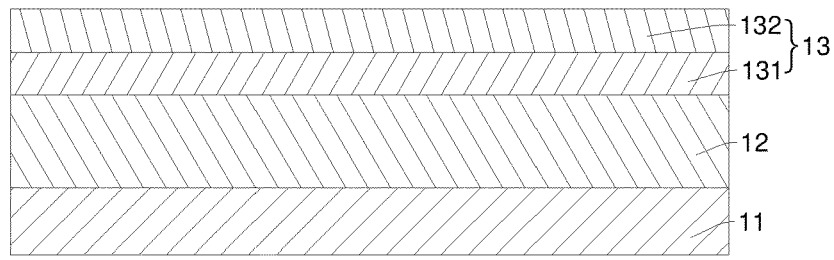
FIG. 1 is a schematic structural view of a top-emission type organic EL element according to a first embodiment of the disclosure.

Referring to FIG. 1, the first embodiment of the disclosure provides a top-emission type organic electroluminescent (EL) element, such as a top-emission type organic light emission diode (OLED). As show in FIG. 1, the top-emission type organic EL element 10, for example includes a first electrode 11, an organic functional layer 12 and a second electrode 13.

As show in FIG. 1, the organic functional layer 12 is disposed on the first electrode 11, the second electrode 13 is disposed on a side of the organic functional layer 12 facing away from the first electrode 11. The second electrode 13 for example includes a work-function adjustment layer 131 and a transparent metal oxide layer 132, the work-function adjustment layer 131 is disposed on the side of the organic functional layer 12 facing away from the first electrode 11, and the transparent metal oxide layer 132 is disposed on a side of the work-function adjustment layer 131 facing away from the organic functional layer 12.

Further, the organic functional layer 12 for example is disposed on the first electrode 11 and in contact with the first electrode 11. The second electrode 13 for example is disposed on the side of the organic functional layer 12 facing away from the first electrode 11 and in contact with the organic functional layer 12. The second electrode 13 for example includes the work-function adjustment layer 131 and the transparent metal oxide layer 132. The work-function adjustment layer 131 for example is disposed on the side of the organic functional layer 12 facing away from the first electrode 11 and in contact with the organic functional layer 12. The transparent metal oxide layer 132 for example is disposed on the side of the work-function adjustment layer 131 facing away from the organic functional layer 12 and in contact with the work-function adjustment layer 131.

In particular, the first electrode 11 is an anode, material forming the first electrode 11 includes, for example: silver (Ag), aluminum (Al), gold (Au), magnesium (Mg), or a metal alloy consisting of either silver, aluminum, gold or magnesium. The first electrode 11 is formed for example by a vacuum evaporation process.

The organic functional layer 12 for example includes at least one light-emitting layer that emits light of different colors depending on the type of the organic material. The organic functional layer 12 is formed for example by stacking at least one light-emitting layer through the vacuum evaporation process.

The second electrode 13 is a cathode. The work-function adjustment layer 131 includes one selected from the group consisting of lithium (Li), calcium (Ca), magnesium (Mg), ytterbium (Yb), and a transparent metal alloy; and the transparent metal alloy consists of at least two metals with different work functions. For example, the transparent metal alloy includes one selected from the group consisting of calcium aluminum alloy, calcium silver alloy, and ytterbium silver alloy. It can be understood here that there is a difference in the metal work function required by the transparent metal alloy in the work-function adjustment layer 131, and the combination can form a stepped shape, thereby facilitating electron injection. Besides, a high transparency (visible light transmittance T>85%) can be formed by adjusting the proportion. On the basis of this realization, the transparent metal alloy can be formed by any combination of metals. Among them, the work-function adjustment layer 131 has a lower work function that can be matched with the organic materials of the organic functional layer, and it has a higher metal activity, which is conducive to the transmission of the electrons.

Furthermore, the work-function adjustment layer 131 can be prepared by the existing vacuum evaporation process or the vacuum sputtering coating process, and a thickness of the work-function adjustment layer 131 is in a range from 5 nm to 50 nm, for example.

Suitable materials for the transparent metal oxide layer 132 such as ITO, $In_2O_3$ (IZO), or other transparent metal oxides. The visible light transmittance of the transparent metal oxide layer 132 is T, for example, T>85%. The transparent metal oxide layer 132 has the good stability, electrical conductivity and light transmittance.

Further, the transparent metal oxide layer 132 can be prepared by the existing vacuum sputtering coating equipment. A thickness of the transparent metal oxide layer 132 is in a range from 10 nm to 150 nm, for example.

By setting the second electrode to include the work-function adjustment layer and the transparent metal oxide layer, the work-function adjustment layer is dispose on the side of the organic functional layer facing away from the first electrode, the transparent metal oxide layer is dispose on the side of the work-function adjustment layer facing away from the organic functional layer, and by adjusting the thickness of the work-function adjustment layer and the transparent metal oxide layer to reduce the work function, thereby reducing the injection energy barrier, that is, the electron transport between the second electrode and the organic functional layer, it makes electrons injection into the electron transport layer of the organic functional layer more easier, and the top-emission type organic EL element have the good conductivity and light transmittance; it can improve the efficiency of the electron injection into the organic functional layer, reduce the starting voltage, improve the light-emitting efficiency, avoid the damage of the organic material, prolong the service life, and use existing technology to complete the formation of the second electrode, the process is simple and mature, and the production cost can be controlled.

Figure 2:
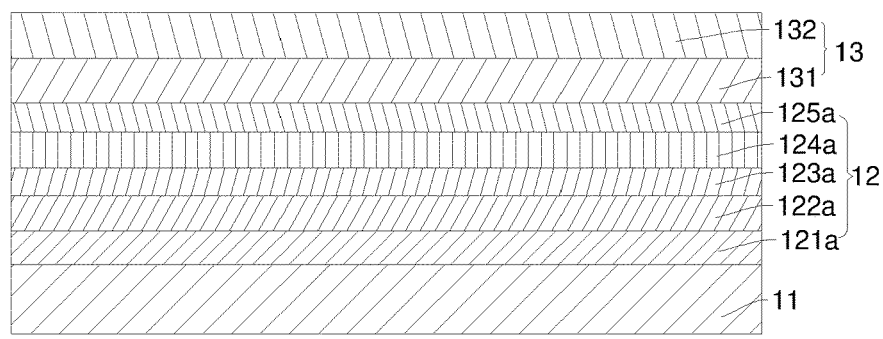
FIG. 2 is another schematic structural view of the top-emission type organic EL element according to the first embodiment of the disclosure.

In other embodiments of the disclosure, as shown in FIG. 2, the organic functional layer 12 is a polychromatic organic functional layer including a hole injection layer 121*a*, a hole transportation layer 122*a*, a light-emitting layer 123*a*, an electron transportation layer 124*a* and an electron injection layer 125*a* sequentially stacked in that order. The hole injection layer 121*a* is disposed on the first electrode 11 and in contact with the first electrode 11. The hole transportation layer 122*a* is disposed on the side of the hole injection layer 121*a* facing away from the first electrode 11 and in contact with the hole injection layer 121*a*. The light-emitting layer 123*a* is disposed on the side of the hole transportation layer 122*a* facing away from the hole injection layer 121*a*, and in contact with the hole transportation layer 122*a*. The electron transportation layer 124*a* is disposed on the side of the light-emitting layer 123*a* facing away from the hole transportation layer 122*a*, and in contact with the light-emitting layer 123*a*. The electron injection layer 125*a* is disposed on the side of the electron transportation layer 124*a* facing away from the light-emitting layer 123*a*, one side of the electron injection layer 125*a* is in contact with the electron transportation layer 124*a*, another side of the electron injection layer 125*a* is in contact with the work-function adjustment layer 131 of the second electrode 13. The work-function adjustment layer 131 is in contact with the electron injection layer 125*a*, which facilitates the electron transmission, and avoids the damage of the electron transportation layer when making the transparent metal oxide layer 132 in the vacuum sputtering process, thus improving the service life.

Suitable materials for the hole injection layer (HIL) 121*a* include, for example one or more of the following: CuPc (29H, 31H-phthalocyaninato(2-)-N29,N30, N31,N32)copper), and TNATA (4,4',4"-tris[2-naphthyl(phenyl)amino]triphenylamine). Suitable materials for the hole transportation layer (HTL) 122*a* include, for example, one or more of the following: NPB (N,N'-bis-(1-naphthalenyl)-N,N'-bis-phenyl-(1,1'-biphenyl)-4,4'-diamine), TPTE (N,N'-bis(Phenyl)-N,N'-bis(4'-(N,N-bis(Phenylamino)biphenyl-4-yl)benzidine), spiro-TAD (N,N'-bis(3-methylphenyl)-N,N'-diphenyl-9,9-spirobifluorene-2,7-diamine), BFA-1T (2(2(4, 4-Dimethyl-N,N'-diphenyl)-phenylthiophene), TDAB (1,3, 5-tris (phenylamino) benzene), TDAPB(1,3,5-tri(p-pyrid-3-yl-phenyl)benzene), PTDATA (N1-phenyl-N4,N4-bis(4-(phenyl(m-tolyl)amino)phenyl)-N1-(m-tolyl)benzene-1,4-diamine), p-DPA-TDAB (1,3,5-tris(diphenylamino) benzene), and MTBDAB (4,4',4"-tris(N-3-methylphenyl-N-diphenylamino) benzene).

Suitable materials for the electron injection layer (EIL) 125*a* include, for example one or more of the following: lithium oxide, lithium boron oxide, potassium silicon oxide, potassium carbonate, cesium carbonate, acetate (CH3COOR) and metal fluoride (RF). Suitable materials for the electron transportation layer (ETL) 124*a* include, for example one or more of the following: chelate, quinoline derivatives, oxoline derivatives, diazanthracene derivatives and phenanthroline derivatives.

By setting the organic functional layer 13 as the monochromatic organic function layer, the top-emission type organic EL element 10 can be realized as a monochromatic element.

Figure 3:
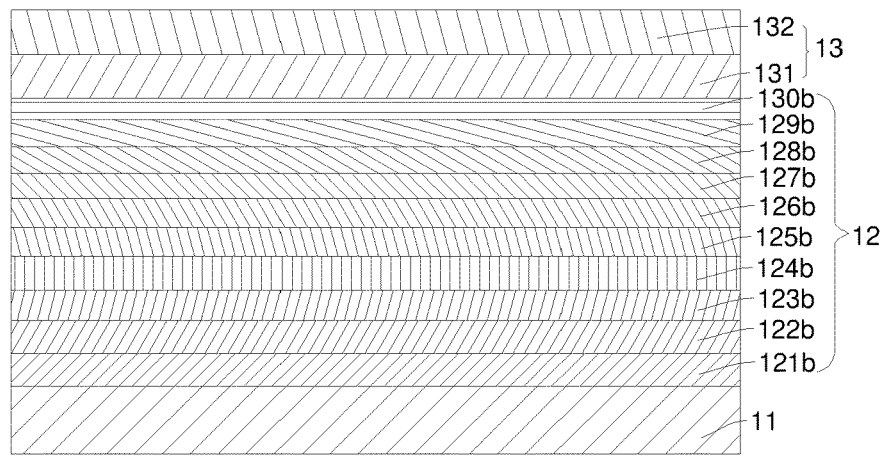
FIG. 3 is still another schematic structural view of the top-emission type organic EL element according to the first embodiment of the disclosure.

In other embodiments of the disclosure, as shown in FIG. 3, the organic functional layer 12 is a polychromatic organic functional layer including a hole injection layer 121*b*, a hole transportation layer 122*b*, a light-emitting layer 123*b*, an electron transportation layer 124*b*, an N-type charge generation layer 125*b*, a P-type charge generation layer 126*b*, a hole transportation layer 127*b*, a light-emitting layer 128*b*, an electron transportation layer 129*b* and an electron injection layer 130*b* sequentially stacked in that order. Specifically, the hole injection layer 121*b* is disposed on the first electrode 11 and in contact with the first electrode 11. The hole transportation layer 122*b* is disposed on the side of the hole injection layer 121*b* facing away from the first electrode 11 and in contact with the hole injection layer 121*b*. The light-emitting layer 123*b* is disposed on the side of the hole transportation layer 122*b* facing away from the hole injection layer 121*b*, and in contact with the hole transportation layer 122*b*. The electron transportation layer 124*b* is disposed on the side of the light-emitting layer 123*b* facing away from the hole transportation layer 122*b*, and in contact with the light-emitting layer 123*b*. The N-type charge generation layer 125*b* is disposed on the side of the electron transportation layer 124*b* facing away from the light-emitting layer 123*b*, and in contact with the electron transportation layer 124*b*. The P-type charge generation layer 126*b* is disposed on the side of the N-type charge generation layer 125*b* facing away from the electron transportation layer 124*b*, and in contact with the N-type charge generation layer 125*b*. The hole transportation layer 127*b* is disposed on the side of the P-type charge generation layer 126*b* facing away from the N-type charge generation layer 125*b*, and in contact with the P-type charge generation layer 126b. The light-emitting layer 128b is disposed on the side of the hole transportation layer 127b facing away from the P-type charge generation layer 126b, and in contact with the hole transportation layer 127b. The electron transportation layer 129b is disposed on the side of the light-emitting layer 128b facing away from the hole transportation layer 127b, and in contact with the light-emitting layer 128b. The electron injection layer 130b is disposed on the side of the electron transportation layer 129b facing away from the light-emitting layer 128b, one side of the electron injection layer 130b is in contact with the electron transportation layer 129b, another side of the electron injection layer 130b is in contact with the work-function adjustment layer 131 of the second electrode 13.

Suitable materials for the hole injection layer (HIL) 121b include, for example one or more of the following: CuPc (29H,31H-phthalocyaninato(2-)-N29,N30,N31,N32)copper), and TNATA (4,4',4"-tris[2-naphthyl(phenyl)amino]triphenylamine). Suitable materials for the hole transportation layer (HTL) 122b and the hole transportation layer (HTL) 127b include, for example, one or more of the following: NPB (N,N'-bis-(1-naphthalenyl)-N,N'-bis-phenyl-(1,1'-biphenyl)-4,4'-diamine), TPTE (N,N'-bis(Phenyl)-N,N'-bis(4'-(N,N-bis(Phenylamino)biphenyl-4-yl)benzidine), spiro-TAD (N,N'-bis(3-methylphenyl)-N,N'-diphenyl-9,9-spirobifluorene-2,7-diamine), BFA-1T (2(2(4,4-Dimethyl-N,N'-diphenyl)-phenylthiophene), TDAB (1,3,5-tris(phenylamino)benzene), TDAPB(1,3,5-tri(p-pyrid-3-yl-phenyl)benzene), PTDATA (N1-phenyl-N4,N4-bis(4-(phenyl(m-tolyl)amino)phenyl)-N1-(m-tolyl)benzene-1,4-diamine), p-DPA-TDAB (1,3,5-tris(diphenylamino)benzene), and MTBDAB (4,4',4"-tris(N-3-methylphenyl-N-diphenylamino) benzene).

Suitable materials for the electron injection layer (EIL) 130b include, for example one or more of the following: lithium oxide, lithium boron oxide, potassium silicon oxide, potassium carbonate, cesium carbonate, acetate (CH3COOR) and metal fluoride (RF). Suitable materials for the electron transportation layer (ETL) 129b and the electron transportation layer (ETL) 124b include, for example one or more of the following: chelate, quinoline derivatives, oxoline derivatives, diazanthracene derivatives and phenanthroline derivatives.

Suitable materials for the N-type charge generation layer 125b, for example include: alkali alkaline with a low work function, earth metals with a low work function or metal compounds with a low work function. For example, include Li, K, Ca, Cs, Mg, LiF, $Li_2CO_3$, CsF, $Cs_2CO_3$, $CsN_3$, or $Rb_2CO_3$. Suitable materials for the P-type charge generation layer 126b, for example include: metal oxides, organic materials, or P-type doped organic materials, for example, metal oxides include: $MoO_3$, $WO_3$, or $V_2O_5$, organic materials such as HATCN; P-type doped organic materials such as: F4-TCNQ, etc.

By setting the organic functional layer 13 as the polychromatic organic functional layer, the top-emission type organic EL element 10 can be used as a polychromatic element, which has a wide range of the application.

The aforementioned organic functional layer 13 includes two light-emitting layers (the light-emitting layer 123b and the light-emitting layer 128b), which are two-color organic functional layers. Of course, the embodiment of the disclosure is not limited to this. The organic functional layer 13 may also include other numbers of the N-type charge generation layers, the P-type charge generation layers, the electron injection layers, the electron transportation layers, the light-emitting layers, the hole injection layers and the hole transportation layer stacked in sequence, so as to achieve more colors.

In summary, the top-emission type organic EL element of this embodiment can improve the efficiency of the electron injection into the organic functional layer, reduce the starting voltage, improve the light-emitting efficiency, avoid the damage of the organic material, prolong the service life, and use existing technology to complete the formation of the second electrode, the process is simple and mature, and the production cost can be controlled.

Second Embodiment

Figure 4:
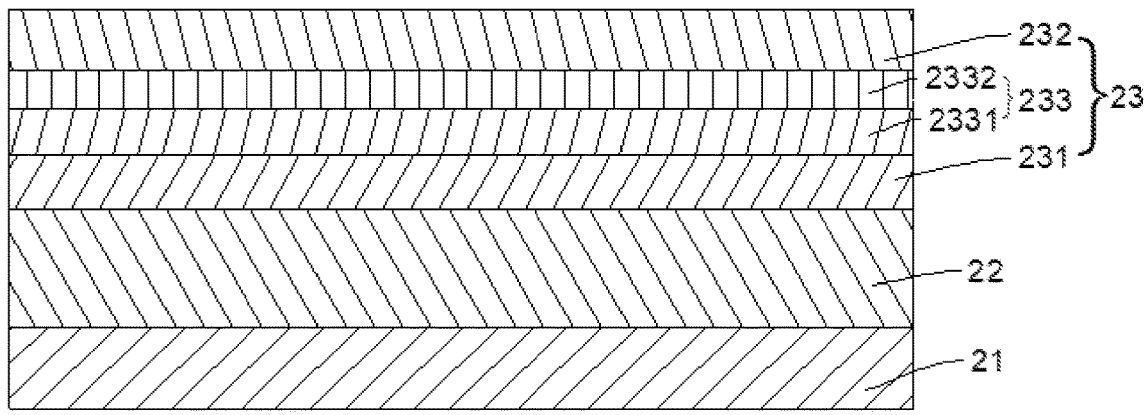
FIG. 4 is a schematic structural view of a top-emission type organic EL element according to a second embodiment of the disclosure.

Referring to FIG. 4, the second embodiment of the disclosure provides a top-emission type organic EL element, such as a top-emission type OLED. As show in FIG. 4, the top-emission type organic EL element 20, for example includes a first electrode 21, an organic functional layer 22 and a second electrode 23.

As show in FIG. 4, the organic functional layer 22 is disposed on the first electrode 21, the second electrode 23 is disposed on a side of the organic functional layer 22 facing away from the first electrode 21. The second electrode 23 for example includes a work-function adjustment layer 231 and a transparent metal oxide layer 232, the work-function adjustment layer 231 is disposed on the side of the organic functional layer 22 facing away from the first electrode 21, and the transparent metal oxide layer 232 is disposed on a side of the work-function adjustment layer 231 facing away from the organic functional layer 22.

As shown in FIG. 4, the difference between the top-emission type organic EL element 20 disclosed in this embodiment and the top-emission type organic EL element 10 disclosed in the first embodiment is that, the second electrode 23 of the top-emission type organic EL element 20 further includes: a charge generation layer 233, the charge generation layer 233 is disposed between the work-function adjustment layer 231 and the transparent metal oxide layer 232. The charge generation layer 233 includes a first-type charge generation layer 2331 and a second-type charge generation layer 2332, the first-type charge generation layer 2331 is disposed on the side of the work-function adjustment layer 231 facing away from the organic functional layer 22, and the second-type charge generation layer 2332 is disposed between the first-type charge generation layer 2331 and the transparent metal oxide layer 232.

Further, the organic functional layer 22 for example is disposed on the first electrode 21 and in contact with the first electrode 21. The second electrode 23 for example is disposed on the side of the organic functional layer 22 facing away from the first electrode 21 and in contact with the organic functional layer 22. The work-function adjustment layer 231 for example is disposed on the side of the organic functional layer 22 facing away from the first electrode 21 and in contact with the organic functional layer 22. The first-type charge generation layer 2331 for example is disposed on the side of the work-function adjustment layer 231 facing away from the organic functional layer 22 and in contact with the work-function adjustment layer 231. The second-type charge generation layer 2332 for example is disposed between the first-type charge generation layer 2331 and the transparent metal oxide layer 232, one side of the second-type charge generation layer 2332 is in contact with the first-type charge generation layer 2331, and another side of the second-type charge generation layer 2332 is in contact with the transparent metal oxide layer 232. The transparent metal oxide layer 232 for example is disposed on the second-type charge generation layer 2332 facing away from the first-type charge generation layer 2331, and in contact with the second-type charge generation layer 2332.

In an exemplary embodiment, the first-type charge generation layer 2331 such as a n-CGL, and suitable materials for the first-type charge generation layer 2331, for example include: alkali with the low work function, alkaline earth metals with the low work function, or metal compounds with the low work function, such as include: Li, K, Ca, Cs, Mg, LiF, $Li_2CO_3$, CsF, $Cs_2CO_3$, $CsN_3$, or $Rb_2CO_3$.

Further, the first-type charge generation layer 2331 is prepared by the existing vacuum evaporation process, and a thickness of the first-type charge generation layer 2331 is in a range from 2 nm to 10 nm, for example.

In an exemplary embodiment, the second type charge generating layer 2332 such as a p-CGL, and suitable materials for the second-type charge generation layer 2332 such as metal oxides, include: ITO, $MoO_3$, $WO_3$, or $V_2O_5$, etc.

Further, the second-type charge generation layer 2332 is prepared by the existing vacuum evaporation process, and a thickness of the second-type charge generation layer 2332 is in a range from 5 nm to 20 nm, for example.

By setting the charge generation layer 233, which can avoid the damage to the work-function adjustment layer 231 when making the transparent metal oxide layer 232 in the vacuum sputtering process, further reduce the oxidation damage of the organic materials in the organic functional layer 22, and further prolong the service life.

Similar to the top-emission type organic EL element 10 disclosed in the first embodiment, the top-emission type organic EL element 20 disclosed in the second embodiment can also be the monochromatic element or the polychromatic element, and the top-emission type organic EL element 20 has a wide range of the application.

Figure 5:
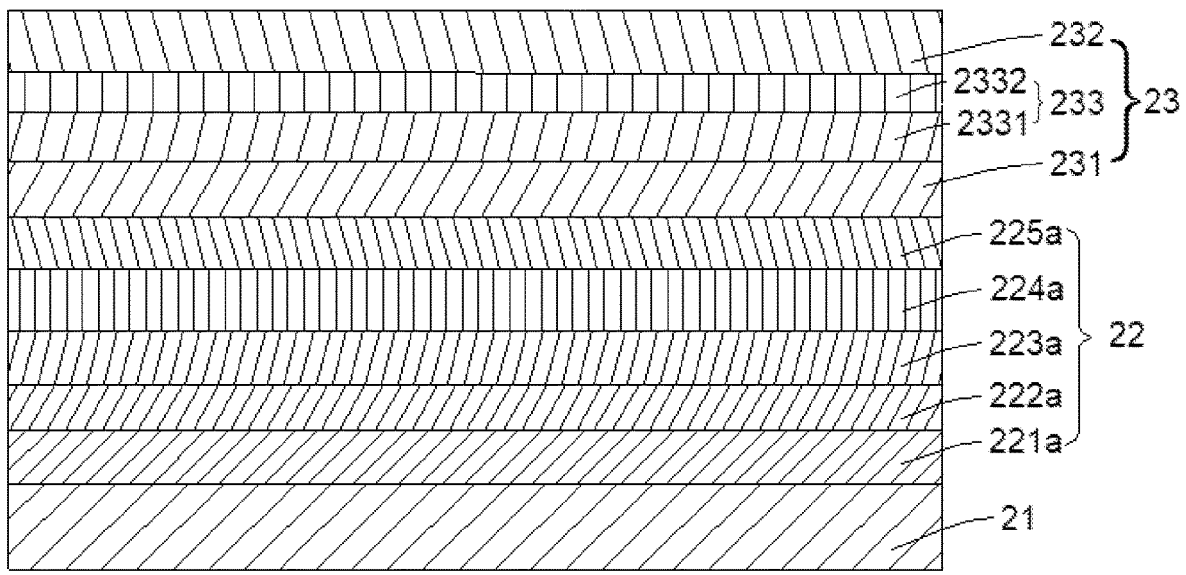
FIG. 5 is another schematic structural view of the top-emission type organic EL element according to the second embodiment of the disclosure.

Specifically, as shown in FIG. 5, the organic functional layer 22 is the polychromatic organic functional layer including a hole injection layer 221a, a hole transportation layer 222a, a light-emitting layer 223a, an electron transportation layer 224a and an electron injection layer 225a sequentially stacked in that order. The hole injection layer 221a is disposed on the first electrode 21 and in contact with the first electrode 21. The hole transportation layer 222a is disposed on the side of the hole injection layer 221a facing away from the first electrode 21 and in contact with the hole injection layer 221a. The light-emitting layer 223a is disposed on the side of the hole transportation layer 222a facing away from the hole injection layer 221a, and in contact with the hole transportation layer 222a. The electron transportation layer 224a is disposed on the side of the light-emitting layer 223a facing away from the hole transportation layer 222a, and in contact with the light-emitting layer 223a. The electron injection layer 225a is disposed on the side of the electron transportation layer 224a facing away from the light-emitting layer 223a, one side of the electron injection layer 225a is in contact with the electron transportation layer 224a, another side of the electron injection layer 225a is in contact with the work-function adjustment layer 231 of the second electrode 23.

Figure 6:
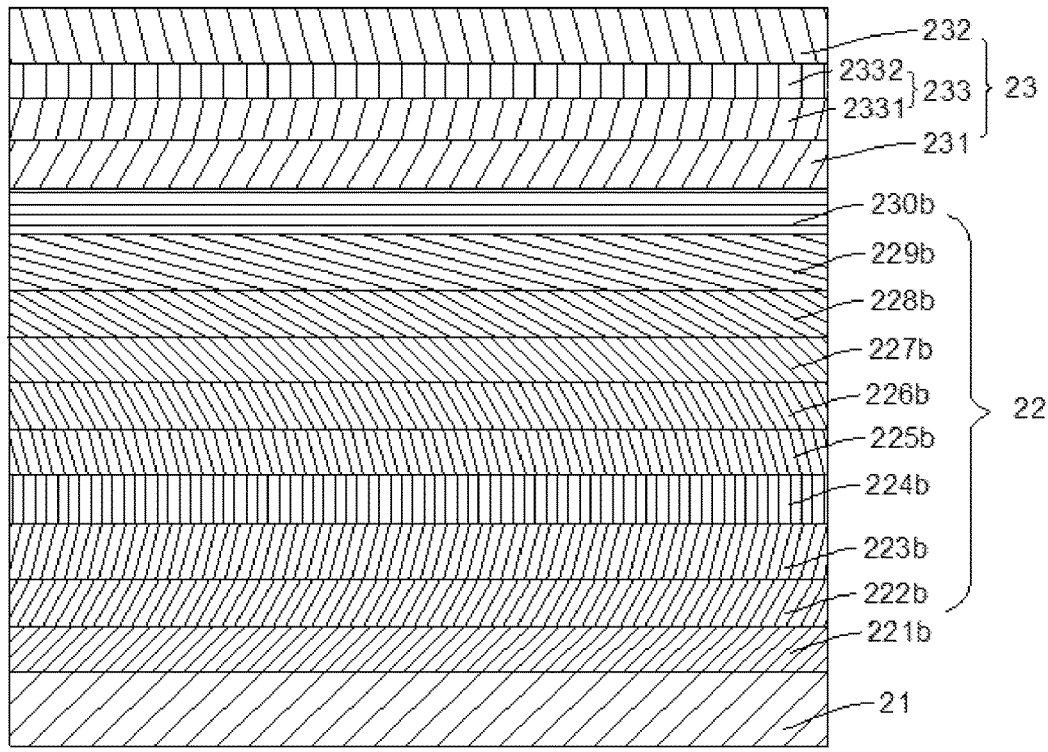
FIG. 6 is still another schematic structural view of the top-emission type organic EL element according to the second embodiment of the disclosure.

In other embodiments of the disclosure, as shown in FIG. 6, the organic functional layer 22 is the polychromatic organic functional layer including a hole injection layer 221b, a hole transportation layer 222b, a light-emitting layer 223b, an electron transportation layer 224b, an N-type charge generation layer 225b, a P-type charge generation layer 226b, a hole transportation layer 227b, a light-emitting layer 228b, an electron transportation layer 229b and an electron injection layer 230b sequentially stacked in that order. Specifically, the hole injection layer 221b is disposed on the first electrode 21 and in contact with the first electrode 21. The hole transportation layer 222b is disposed on the side of the hole injection layer 221b facing away from the first electrode 21 and in contact with the hole injection layer 221b. The light-emitting layer 223b is disposed on the side of the hole transportation layer 222b facing away from the hole injection layer 221b, and in contact with the hole transportation layer 222b. The electron transportation layer 224b is disposed on the side of the light-emitting layer 223b facing away from the hole transportation layer 222b, and in contact with the light-emitting layer 223b. The N-type charge generation layer 225b is disposed on the side of the electron transportation layer 224b facing away from the light-emitting layer 223b, and in contact with the electron transportation layer 224b. The P-type charge generation layer 226b is disposed on the side of the N-type charge generation layer 225b facing away from the electron transportation layer 224b, and in contact with the N-type charge generation layer 225b. The hole transportation layer 227b is disposed on the side of the P-type charge generation layer 226b facing away from the N-type charge generation layer 225b, and in contact with the P-type charge generation layer 226b. The light-emitting layer 228b is disposed on the side of the hole transportation layer 227b facing away from the P-type charge generation layer 226b, and in contact with the hole transportation layer 227b. The electron transportation layer 229b is disposed on the side of the light-emitting layer 228b facing away from the hole transportation layer 227b, and in contact with the light-emitting layer 228b. The electron injection layer 230b is disposed on the side of the electron transportation layer 229b facing away from the light-emitting layer 228b, one side of the electron injection layer 230b is in contact with the electron transportation layer 229b, another side of the electron injection layer 230b is in contact with the work-function adjustment layer 231 of the second electrode 23.

The first electrode 21, the organic functional layer 22, the work-function adjustment layer 231, and the transparent metal oxide layer 232 of the top-emission type organic EL element 20 disclosed in this embodiment can be referred to the first embodiment mentioned above, and will not be repeated here for brevity.

In summary, the top-emission type organic EL element of this embodiment can improve the efficiency of the electron injection into the organic functional layer, reduce the starting voltage, improve the light-emitting efficiency, and use existing technology to complete the formation of the second electrode, the process is simple and mature, and the production cost can be controlled; the top-emission type organic EL element can avoid the damage to the work-function adjustment layer when making the transparent metal oxide layer in the vacuum sputtering process, further reduce the oxidation damage of the organic materials in the organic functional layer, and further prolong the service life, and it is not only suitable for the monochrome OLED, but also suitable for the polychromatic OLED, and therefore has a wide range of the application.

Third Embodiment

Figure 7:
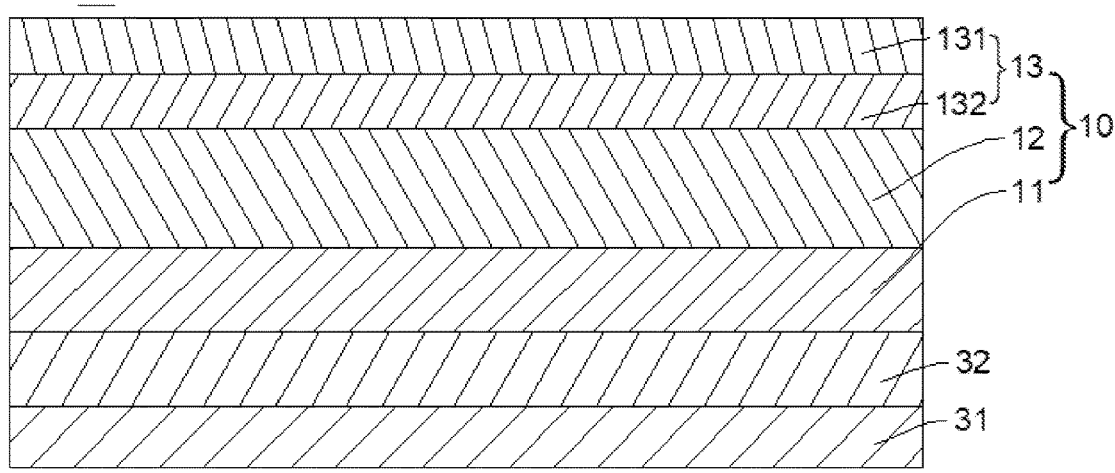
FIG. 7 is a schematic structural view of a top-emission type organic EL device according to a third embodiment of the disclosure.

Referring to FIG. 7, the third embodiment of the disclosure provides a top-emission type organic EL device. As show in FIG. 7, the top-emission type organic EL device 30, for example includes a substrate 31, a drive control circuit layer 32 and the top-emission type organic EL element 10 disclosed in the first embodiment above.

In an exemplary embodiment, the drive control circuit layer 32 is disposed on the substrate 31. The top-emission type organic EL element 10 is disposed on a side of the drive control circuit layer 32 facing away from the substrate 31. The first electrode 11 of the top-emission type organic EL element 10 is disposed on the drive control circuit layer 32, the organic functional layer 12 is disposed on the first electrode 11, and the second electrode 13 is disposed on a side of the organic functional layer 12 facing away from the first electrode 11. The second electrode 13 for example includes the work-function adjustment layer 131 and the transparent metal oxide layer 132, the work-function adjustment layer 131 is disposed on the side of the organic functional layer 12 facing away from the first electrode 11, and the transparent metal oxide layer 132 is disposed on a side of the work-function adjustment layer 131 facing away from the organic functional layer 12.

Specifically, the substrate 31 can be formed from a transparent material. The substrate 31 such as a quartz substrate, an artificial quartz substrate, a calcium fluoride substrate, a fluoride carbide substrate or a sodium calcium glass substrate, etc. Optionally, the substrate 31 can be formed from a flexible transparent material. The substrate 31 such as a polyimide substrate, which may include a first polyimide layer, a barrier membrane layer, and a second polyimide layer, etc.

In an exemplary embodiment, the drive control circuit layer 32 for example includes a plurality of transistors and a storage capacitor connected to the plurality of transistors; and the first electrode 11 of the top-emission type organic EL element 10 is connected to the plurality of transistors. A structure of the transistor, for example, is a top gate structure, a back channel etch (BCE) structure, and an etch stop layer (ESL) structure, etc. Materials of an active layer of the transistor such as oxides, silicon, or organics. Specifically, the materials of the active layer such as: amorphous indium gallium zinc oxide (a-IGZO), nitrogen and zinc oxide (ZnON), IZTO, amorphous silicon (a-Si), low temperature polysilicon (p-Si), six thiophene, or poly (thiophene), etc. The materials of the electrodes and their leads of the transistor can be commonly used metal materials, such as silver (Ag), copper (Cu), aluminum (Al), molybdenum (Mo), etc; or alloy materials of the above metals, such as aluminum neodymium alloy (AlNd), molybdenum niobium alloy (MoNb), etc; or multilayer metals such as MoNb, Cu and MoNb sequentially stacked in that order, etc; The electrodes and their leads of the transistor can also be a stack structure formed by metal and transparent conductive oxides including indium tin oxide (ITO), aluminum-doped zinc oxide (AZO), etc. For example, the stack structure such as Mo, AlNd and stacked ITO sequential in that order or ITO, Ag and ITO sequentially stacked in that order, etc. The materials of Buffer, Gi, ILD and PVX layers include silicon oxide (SiOx), silicon nitrous oxide (SiNx), silicon nitrous oxide (SiON) and other dielectric materials, or various new organic insulating materials, or high dielectric constant materials such as aluminum oxide (AlOx), hafnium oxide (HfOx), and tantalum oxide (TaOx), etc. Drive control circuit layer 32, for example, through a film formation, an exposure, an etching and a superposition of different graphics and different materials of the film layer formation.

Figure 8:
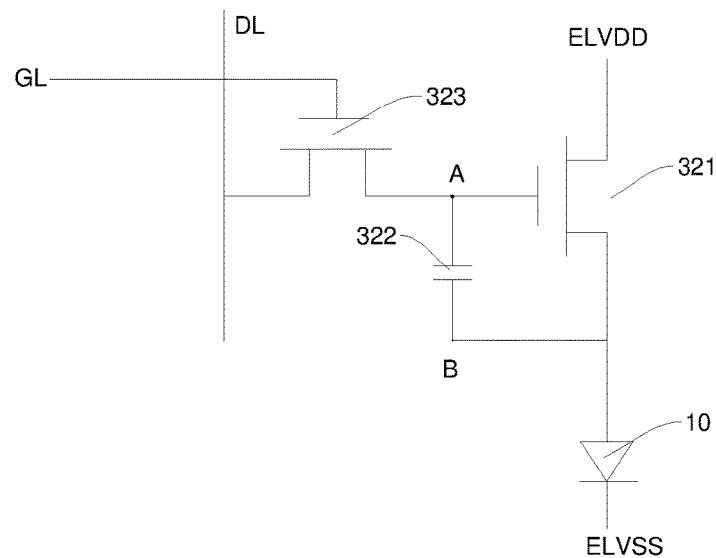
FIG. 8 is a schematic diagram showing a circuit connection between a top-emission type organic EL element and a drive control circuit layer in the top-emission type organic EL device according to the third embodiment of the disclosure.

For example, as shown in FIG. 8, the drive control circuit layer 32 includes, for example, two transistors (321, 323) and a storage capacitor 322. The storage capacitor 322 is electrically connected to the two transistors. The first electrode 11 of the top-emission type organic EL element 10 is electrically connected to the transistor 321 and the transistor 323. As shown in FIG. 8, a positive voltage power supply ELVDD is provided to a positive power supply terminal, and a ground supply voltage ELVSS is provided to a ground power supply terminal, by driving the state of the transistor 321 can control the current flow through the top-emission type organic EL element 10, and therefore can control the emission amount from the top-emission type organic EL element 10. To ensure that the transistor 321 is kept in a desired state between successive frames of the data, the voltage from the storage capacitor 322 is applied to the gate of the transistor 321 at the node A to control the transistor 321. Data can be loaded into the storage capacitor 322 using one or more switching transistors such as the transistor 323. When the transistor 323 is turned on, the data line (DL) is isolated from the storage capacitor 322 and the gate voltage at the node A is equal to the data value stored in the storage capacitor 322. When the gate line, also known as the scan line (GL), is turned off, the transistor 323 will be turned on and the new data signal on the data line DL will be loaded into the storage capacitor 322. The new data signal from the storage capacitor 322 is applied to the gate of the transistor 321 at the node A, thereby adjusting the state of the transistor 321 and the corresponding amount of light emitted by the top-emission type organic EL element 10.

It should be noted that the disclosure does not limit the specific structure of the drive control circuit layer 32. The foregoing and the diagrams are shown only to better illustrate this embodiment.

The relevant description of the top-emission type organic EL element 10 can be referred to the first embodiment mentioned above, and the beneficial effect of this embodiment is the same as that of the first embodiment mentioned above, which is not repeated here for brevity.

Fourth Embodiment

Figure 9:
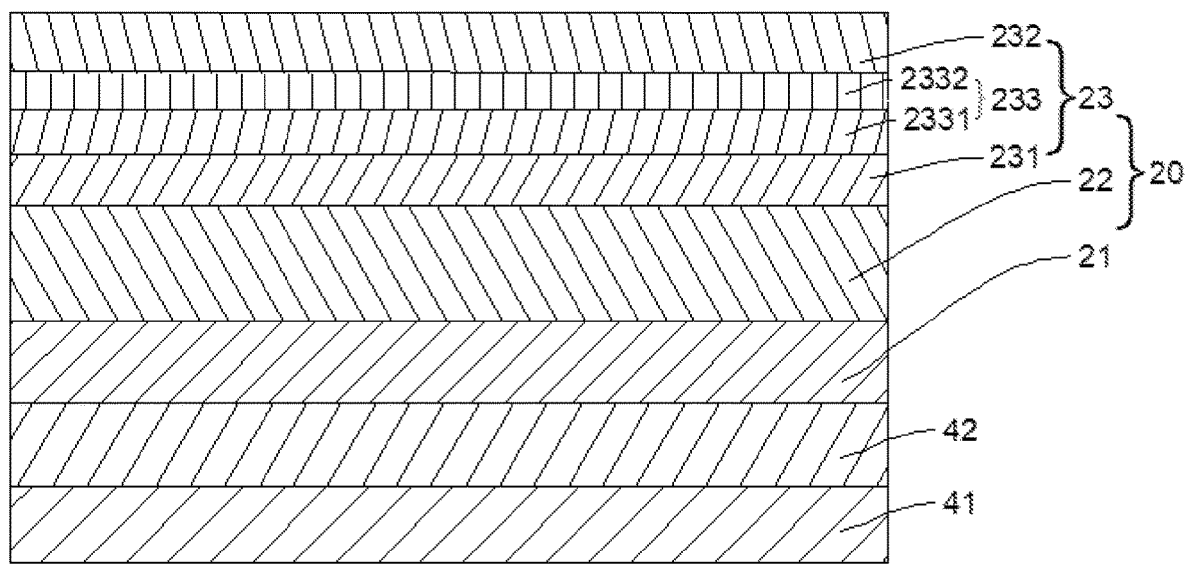
FIG. 9 is a schematic structural view of a top-emission type organic EL device according to a fourth embodiment of the disclosure.

Refer to FIG. 9, the fourth embodiment of the disclosure provides a top-emission type organic EL device. As shown in FIG. 9, a top-emission type organic EL device 40 includes, for example, a substrate 41, a drive control circuit layer 42, and the top-emission type organic EL element 20 disclosed in the second embodiment above.

In an exemplary embodiment, the drive control circuit layer 42 is disposed on the substrate 41. The top-emission type organic EL element 20 is disposed on a side of the drive control circuit layer 42 facing away from the substrate 41. The first electrode 21 of the top-emission type organic EL element 20 is disposed on the drive control circuit layer 42, the organic functional layer 22 is disposed on the first electrode 21, and the second electrode 23 is disposed on a side of the organic functional layer 22 facing away from the first electrode 21. The second electrode 23 for example includes the work-function adjustment layer 231, the transparent metal oxide layer 232 and the charge generation layer 233. The work-function adjustment layer 231 is disposed on the side of the organic functional layer 22 facing away from the first electrode 21, the transparent metal oxide layer 232 is disposed on a side of the work-function adjustment layer 231 facing away from the organic functional layer 22, and the charge generation layer 233 is disposed between the work-function adjustment layer 231 and the transparent metal oxide layer 232. The charge generation layer 233 includes the first-type charge generation layer 2331 and the second-type charge generation layer 2332, the first-type charge generation layer 2331 is disposed on the side of the work-function adjustment layer 231 facing away from the organic functional layer 22, and the second-type charge generation layer 2332 is disposed between the first-type charge generation layer 2331 and the transparent metal oxide layer 232.

Specifically, the substrate 41 can be formed from a transparent material. The substrate 41 such as a quartz substrate, an artificial quartz substrate, a calcium fluoride substrate, a fluoride carbide substrate or a sodium calcium glass substrate, etc. Optionally, the substrate 41 can be formed from a flexible transparent material. The substrate 41 such as a polyimide substrate, which may include a first polyimide layer, a barrier membrane layer, and a second polyimide layer, etc.

In an exemplary embodiment, the drive control circuit layer 42 for example includes a plurality of transistors and a storage capacitor connected to the plurality of transistors; and the first electrode 21 of the top-emission type organic EL element 20 is connected to the plurality of transistors. A structure of the transistor, for example, is a top gate structure, a back channel etch (BCE) structure, and an etch stop layer (ESL) structure, etc. Materials of an active layer of the transistor such as oxides, silicon, or organics. Specifically, the materials of the active layer such as: amorphous indium gallium zinc oxide (a-IGZO), nitrogen and zinc oxide (ZnON), IZTO, amorphous silicon (a-Si), low temperature polysilicon (p-Si), six thiophene, or poly (thiophene), etc. The materials of the electrodes and their leads of the transistor can be commonly used metal materials, such as silver (Ag), copper (Cu), aluminum (Al), molybdenum (Mo), etc; or alloy materials of the above metals, such as aluminum neodymium alloy (AlNd), molybdenum niobium alloy (MoNb), etc; or multilayer metals such as MoNb, Cu and MoNb, sequentially stacked in that order, etc. The electrodes and their leads of the transistor can also be a stack structure formed by metal and transparent conductive oxides including indium tin oxide (ITO), aluminum-doped zinc oxide (AZO), etc. For example, the stack structure such as Mo, AlNd and ITO sequentially stacked in that order or ITO, Ag and ITO sequentially stacked in that order, etc. The materials of Buffer, Gi, ILD and PVX layers include silicon oxide (SiOx), silicon nitrous oxide (SiNx), silicon nitrous oxide (SiON) and other dielectric materials, or various new organic insulating materials, or high dielectric constant materials such as aluminum oxide (AlOx), hafnium oxide (HfOx), and tantalum oxide (TaOx), etc. Drive control circuit layer 42, for example, through a film formation, an exposure, an etching and a superposition of different graphics and different materials of the film layer formation.

The specific structure of the drive control circuit layer 42 can be illustrated by referring to the example of the drive control circuit layer 32 of the top-emission type organic EL device 30 disclosed in the third embodiment above, which will not be repeated here.

The relevant description of the top-emission type organic EL element 20 may be referred to the second embodiment above, and the beneficial effect of this embodiment is the same as that of the second embodiment described above, which will not be repeated herein for brevity.

Finally, it should be noted that the above embodiments are only used to illustrate the technical solutions of the disclosure, rather than to limit the disclosure. Although the disclosure has been described in detail with reference to the foregoing embodiments, those of ordinary skill in the art should understand that the technical solutions illustrated in the foregoing embodiments may be modified, or some of the technical features may be equivalently substituted. These modifications or substitutions do not make the essence of corresponding technical solutions deviate from the spirit and scope of the technical solutions of various embodiments of the disclosure.

What is claimed is:

1. A top-emission type organic electroluminescent element, comprising:
   a first electrode;
   an organic functional layer, disposed on the first electrode; and
   a second electrode, disposed on a side of the organic functional layer facing away from the first electrode;
   wherein the second electrode comprises a work-function adjustment layer and a transparent metal oxide layer, the work-function adjustment layer is disposed on the side of the organic functional layer facing away from the first electrode, and the transparent metal oxide layer is disposed on a side of the work-function adjustment layer facing away from the organic functional layer;
   wherein the second electrode further comprises: a charge generation layer, disposed between the work-function adjustment layer and the transparent metal oxide layer; and
   wherein the charge generation layer comprises a first-type charge generation layer and a second-type charge generation layer, the first-type charge generation layer is disposed on the side of the work-function adjustment layer facing away from the organic functional layer, and the second-type charge generation layer is disposed between the first-type charge generation layer and the transparent metal oxide layer.

2. The top-emission type organic electroluminescent element as claimed in claim 1, wherein a thickness of the work-function adjustment layer is in a range from 5 nanometers (nm) to 50 nm, and a thickness of the transparent metal oxide layer is in a range from 10 nm to 150 nm.

3. The top-emission type organic electroluminescent element as claimed in claim 1, wherein a thickness of the first-type charge generation layer is in a range from 2 nm to 10 nm, and a thickness of the second-type charge generation layer is in a range from 5 nm to 20 nm.

4. The top-emission type organic electroluminescent element as claimed in claim 1, wherein the work-function adjustment layer comprises one selected from the group consisting of lithium (Li), calcium (Ca), magnesium (Mg), ytterbium (Yb), and a transparent metal alloy; and the transparent metal alloy consists of at least two metals with different work functions.

5. The top-emission type organic electroluminescent element as claimed in claim 1, wherein the first electrode is an anode, and the second electrode is a cathode.

6. The top-emission type organic electroluminescent element as claimed in claim 1, wherein the organic functional layer is a monochromatic organic functional layer comprising a hole injection layer, a hole transportation layer, a light-emitting layer, an electron transportation layer and an electron injection layer sequentially stacked in that order.

7. The top-emission type organic electroluminescent element as claimed in claim 1, wherein the organic functional layer is a polychromatic organic functional layer comprising a first hole injection layer, a first hole transportation layer, a first light-emitting layer, a first electron transportation layer, an N-type charge generation layer, a P-type charge generation layer, a second hole transportation layer, a second light-emitting layer, a second electron transportation layer and a first electron injection layer sequentially stacked in that order.

* * * * *